(12) United States Patent
Chen et al.

(10) Patent No.: US 6,692,619 B1
(45) Date of Patent: Feb. 17, 2004

(54) SPUTTERING TARGET AND METHOD FOR MAKING COMPOSITE SOFT MAGNETIC FILMS

(75) Inventors: Qixu Chen, Milpitas, CA (US); Fernando Anaya Chavez, Hayward, CA (US); Charles Frederick Brucker, Pleasanton, CA (US); Rajiv Yadav Ranjan, San Jose, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/067,833

(22) Filed: Feb. 8, 2002

Related U.S. Application Data
(60) Provisional application No. 60/312,329, filed on Aug. 14, 2001.

(51) Int. Cl.[7] .......................... C23C 14/34; C23C 14/35
(52) U.S. Cl. .............................. 204/192.2; 204/298.12; 204/298.13; 204/192.12
(58) Field of Search ...................... 204/298.12, 298.13, 204/298.16, 192.12, 192.15, 192.2; 420/89, 94, 93, 97, 121, 123, 435, 436, 440, 441, 442, 452, 457, 458, 459; 148/306, 310, 311, 312, 313, 330, 332, 336, 426, 427

(56) References Cited

U.S. PATENT DOCUMENTS

| | | | |
|---|---|---|---|
| 4,415,427 A | 11/1983 | Hidler et al. ............... | 204/298 |
| 5,922,177 A | 7/1999 | Iketani et al. .......... | 204/192.15 |
| 5,968,678 A | 10/1999 | Tanase et al. ......... | 428/694 ML |
| 5,976,688 A | 11/1999 | Kawase et al. ............. | 428/332 |
| 5,976,715 A | 11/1999 | Chen et al. ............... | 428/694 T |
| 5,998,048 A | 12/1999 | Jin et al. .................. | 428/694 T |
| 6,033,536 A | 3/2000 | Ichihara et al. .......... | 204/192.2 |
| 6,183,606 B1 | 2/2001 | Kuo et al. ............. | 204/192.15 |
| 6,488,822 B1 * | 12/2002 | Moslehi ................. | 204/192.12 |
| 2002/0160229 A1 * | 10/2002 | Kim et al. ............... | 428/694 T |

FOREIGN PATENT DOCUMENTS

| EP | 634499 A1 * | 1/1995 | ........... C23C/14/34 |
|---|---|---|---|

OTHER PUBLICATIONS

"Properties of Magnetic Materials", H.P.R. Frederkse, CSC Press LLC (2000).*

* cited by examiner

Primary Examiner—Steven H. VerSteeg
(74) Attorney, Agent, or Firm—Morrison & Foerster LLP

(57) ABSTRACT

A high-saturation magnetization composite soft magnetic film can be deposited by magnetron co-sputtering of two or more kinds of materials using targets which have a lower saturation magnetization than that of a single target, which otherwise will be used to produce the resulting composite soft magnetic film. The composite film has a substantially uniform composition and thickness.

20 Claims, 5 Drawing Sheets

SPUTTERING TARGET AND METHOD FOR MAKING COMPOSITE SOFT MAGNETIC FILMS

RELATED APPLICATIONS

This application claims priority from Provisional Application Ser. No. 60/312,329 filed Aug. 14, 2001, entitled "Method for Making Composite Soft Magnetic Films," the entire disclosure of which is hereby incorporated herein by reference.

FIELD OF INVENTION

This invention relates to a sputtering target and method of making a soft magnetic film of a recording head or recording media, such as those in thin film magnetic recording.

BACKGROUND

Composite soft magnetic thin films are widely used in commercial applications, for instance, in magnetic recording heads. Also, a perpendicular magnetic recording medium usually has a soft magnetic underlayer of about 2000 Å thickness, which is conventionally made with magnetron sputtering. Magnetron sputtering has several advantages over diode sputtering, such as high deposition rate. It is very difficult, however, to use magnetron sputtering for soft magnetic materials because the targets of soft magnetic materials shunt the magnetic flux from the magnets of magnetron cathodes. Therefore, in order to properly operate the magnetron, a magnetic field of more than 150 Oe is required to be applied above and parallel to the target surface. However, when the magnetic field is about 150 Oe, the deposition rate of soft magnetic materials is still very slow. The conventional method for enabling the magnetron function for soft magnetic materials is to reduce the target thickness to minimize the shunting effect of the target. Even though the magnetron can marginally work by this method, the deposition rate is still too low.

In a perpendicular recording medium, the thickness of the soft magnetic layer is about 2000 Å. This thickness is much larger than the thickness of other layers in the perpendicular recording medium. For example, the thickness of the interlayer, recording layer and overcoat are about 50 Å, about 200 Å, and about 40 Å respectively. The low deposition rate of the soft magnetic underlayer significantly reduces throughput. Also, thin targets significantly increase shutdown time of sputter machines for changing targets, and are not feasible for mass production.

U.S. Pat. No. 6,033,536 (Ichihara) discloses a magnetron sputtering method using a composite sputtering target consisting of a material having a maximum relative magnetic permeability of 50 or more or consisting of a soft magnetic material which contains two or more phases selected from the group consisting of an M—X alloy phase, an M phase, and an X phase in that at least the simple substance phase consisting of the phase with the smaller atomic weight, M or X, is included, with the proviso that M is not equal to X, M is at least one element selected from the group consisting of Fe, Co and Ni, and X is at least one element selected from the group consisting of Fe, Al, Si, Ta, Zr, Nb, Hf and Ti. In particular, in column 11, lines 19 and 20, Ichihara discloses forming a NiFe film by using a target consisting of a NiFe alloy phase and a Fe phase.

While Ichihara discloses a composite sputtering target (see FIG. 8 of Ichihara) and a magnetron sputtering method, Ichihara is totally different from this invention. Ichihara concerns mainly with the composition consistence of the deposited films. The criterion for the composition of the composite sputtering target of Ichihara is based on atomic weight of the constituent materials (phases) of the target, not the saturation magnetization (Ms) of the constituent materials with respect to the saturation magnetization of the materials with identical composition as that of the resulting composite soft magnetic films. In particular, Ichihara requires that at least one phase of the target must be a simple substance phase having a smallest atomic weight relative to the atomic weights of M and X. Therefore, for forming a NiFe film, Ichihara uses a NiFe alloy phase (M=Ni and X=Fe) and a Fe phase (X=Fe), wherein the simple substance phase, i.e., Fe, has the smallest atomic weight relative to Ni and Fe. However, according to Ichihara, the simple substance phase having the smallest atomic weight, e.g., Fe, has a higher saturation magnetization than that of the sputter deposited film, e.g., NiFe. It is, therefore, more difficult to sputter-deposit Fe by magnetron than FeNi, when saturation magnetization is the main concern.

There are several problems in Ichihara's method, which need to be solved. For example, the erosion of the target of FIG. 8 of Ichihara will not be uniform during sputtering because the magnetic field along the circumferential direction above this target surface will not be uniform, but will change dramatically. The field will be very strong above the Zr phase, and weak above the Fe and FeZr phases, resulting in non-uniform erosion of this target in the circumferential direction.

The soft magnetic target materials do not operate at the maximum permeability regime for a magnetron sputtering application. The magnetic field above the target surface in the plasma and parallel to the target surface must be greater than about 150 Oe to enable magnetron sputtering. The magnetic fields inside and outside the target surface at an area near the target surfaces and parallel to the surfaces of a target are nearly identical. Therefore, the magnetic field inside the target would be about 150 Oe or more. The highest magnetic induction of the widely used soft magnetic materials is known to be about 24000 Gauss. When B=24000 Gauss and H=150 Oe, $\mu$=160 because B=$\mu$H, where B is magnetic induction, $\mu$ is permeability, and H is magnetic field. This value of permeability is 2 to 3 orders of magnitude lower than the maximum permeability of most of commercial metallic soft magnetic materials. Therefore, maximum permeability of the target materials is not a concern of this invention. Instead, this invention is concerned with the problem of high saturation magnetization of the target materials, which is the cause of low pass through flux above the target surface.

Despite some advances in magnetron sputtering of soft magnetic films, there still is a need to find a method that can be used for efficient production of soft magnetic films with single-phase and substantially uniform composition by magnetron sputtering.

SUMMARY OF THE INVENTION

An embodiment of this invention is a magnetron target for sputtering, comprising at least a first sector comprising a first target material $T_1$, having a saturation magnetization $Ms_1$, and a second sector comprising a second target material $t_2$ having a saturation magnetization $Ms_2$, wherein $Ms_1<Ms_3$ and $Ms_2<Ms_3$, wherein $Ms_3$ is the saturation magnetization of a bulk material $T_3$ with the composition of a film formed by co-sputtering $T_1$, and $T_2$.

In one embodiment, the first and second sectors are pie-shaped sectors and locate along the racetrack of the magnetron, wherein preferably 0.9<$Ms_2/Ms_1$<1.1 The target sputters $T_1$, and $T_2$ to form a single-phase film having a substantially uniform thickness and a substantially uniform composition of $T_3$ throughout the single-chase film.

In another embodiment the first and second sectors are concentric ring-shaped sectors with sectors $T_1$, and $T_2$ located along radial direction, wherein preferably each sector has its own power supply.

In one embodiment, $T_1$, comprises $FeNi_x$, and $T_2$ comprises $FeNi_y$, wherein x is in a range from about 29 to about 35 in weight percent and y is in the range from about 70 to 100 in weight percent. In yet another embodiment, $T_1$, comprises a moiety selected from Fe, FeNi and FeB and $T_2$ comprises a moiety selected from Ni, FeNi and Co. In a preferred embodiment, $T_1$, is $FeNi_{32}$ and $T_2$ is Ni. Furthermore, $T_1$, and/or $T_2$ can further comprise an additive selected from Mo, Cr, Mn, Cu, V, C, B, Nb, Zr, Ta and Hf.

Another embodiment is a sputtering method, comprising disposing a substrate opposite a target, applying a magnetic field to the target, applying a sputtering voltage to the target and sputtering a film on the substrate, the target comprising at least a first sector comprising a first target material $T_1$, having a saturation magnetization $Ms_1$, and a second sector comprising a second target material $T_2$ having a saturation magnetization $Ms_2$, wherein $Ms_1$<$Ms_3$ and $Ms_2$<$Ms_3$, wherein $Ms_3$ is the saturation magnetization of a bulk material $T_3$ with the composition of the film.

Yet another embodiment is a sputtering source, comprising a magnet and means for sputtering a plurality of species that form a film comprising a material of higher saturation magnetization than that of the species. In this invention, "means for sputtering a plurality of species that form a film" includes a sputtering target.

As will be realized, this invention is capable of other and different embodiments, and its details are capable of modifications in various obvious respects, all without departing from this invention. Accordingly, the drawings and description are to be regarded as illustrative in nature and not as restrictive.

DETAILED DESCRIPTION

In this invention, the term "single-phase" refers to a phase in which different elements are in contact with each other at an atomic level without a boundary between elements that can be observable by optical microscopy.

The term "bulk material" refers to a material having a thickness of 0.1 μm or more. The term "film" refers to a material having a thickness in a range of more than 0 μm and less than 0.1 μm.

The term "substantially uniform thickness" of a film refers to a thickness of a film in which the maximum and minimum thickness of the film, $t_{max}$ and $t_{min}$, have the following relationship:

$$(t_{max}-t_{min})/t_{max}<0.1 \tag{1a}$$

The term "substantially uniform composition" refers to a composition in which the maximum and minimum concentrations of an element, $C_{max}$ and $C_{min}$, in the composition have the following relationship:

$$(C_{max}-C_{min})/C_{max}<0.1 \tag{1b}$$

The method of the present invention is particularly effective in sputter depositing a soft magnetic film having a single-phase and substantially uniform composition by magnetron sputtering. The soft magnetic film is formed by sputtering materials of a composite target during magnetron sputtering. The materials of the composite target have a lower saturation magnetization than that of the target, which otherwise will be used to produce the resulting soft magnetic film. For example, the soft magnetic film could be a $FeNi_{46.4}$ film and the materials of the composite target could be $FeNi_{32}$ and Ni.

Figure 1:
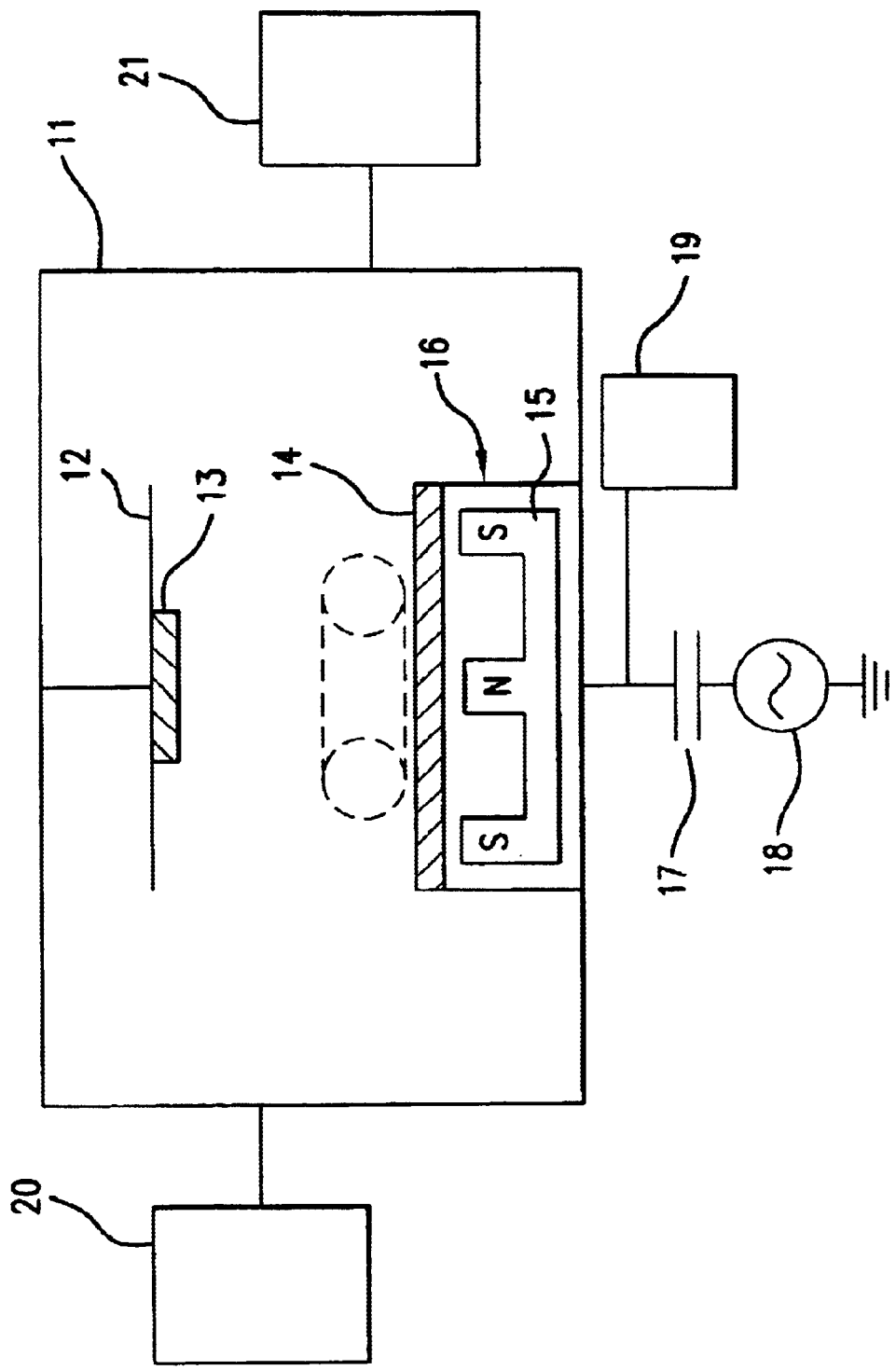
FIG. 1 is a view of a typical magnetron sputtering apparatus.

FIG. 1 shows a typical magnetron sputtering apparatus, such as that of Ichihara, which can be used in the present invention according to the following method. In FIG. 1, in a sputtering chamber 11, a holder 12 is placed. On the holder 12, a substrate 13 is mounted. Also, in the sputtering chamber 11, there is provided a sputtering source 16 consisting of a target 14 and a concentric-type permanent magnet 15 for magnetron discharge disposed on the rear surface of the target 14. The target 14 is connected to a radio frequency power supply 18 via a direct current cut-off capacitance 17. A detector 19 monitors the cathode fall voltage (direct current self bias voltage $V_{DC}$) applied to the target 14. The sputter chamber 11 is evacuated by an evacuation system 20 and a sputtering gas is introduced into the chamber 11 from the gas introducing system 21. Above the target 14, toroidal magnetron plasma is generated. A portion of the target 14 corresponding to the inner side of the magnetron plasma is eroded. The substrate 13 is fixed on the holder 12 right over the eroded portion of the target 14.

FeNi and FeCo alloys are often used as a soft magnetic material. To obtain data necessary for designing the sputtering target of this invention for forming FeNi and FeCo soft magnetic films, the following basic experiments were designed and could be performed in the aforementioned apparatus.

EXAMPLE 1

Figure 2:
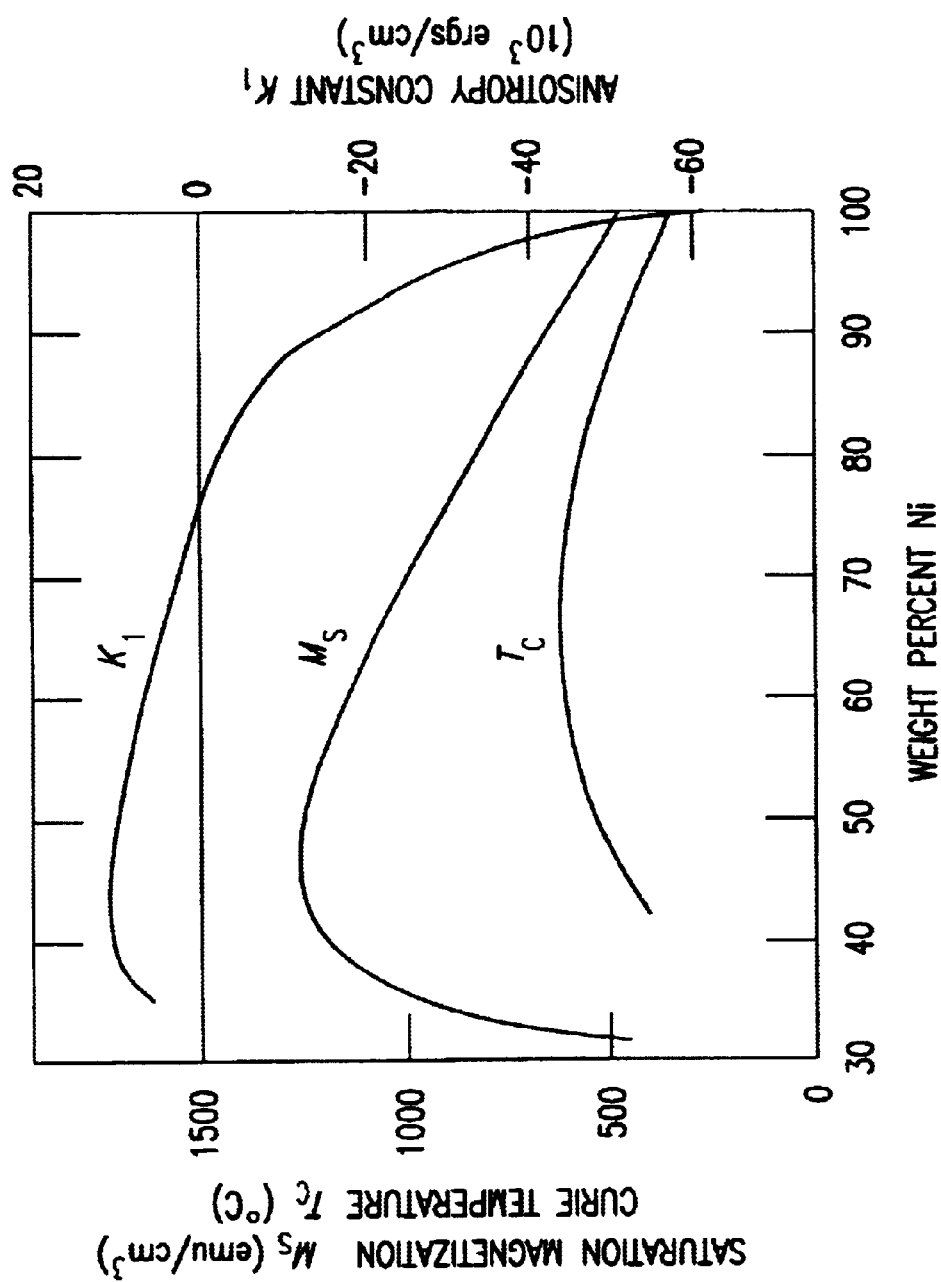
FIG. 2 shows the variations in saturation magnetization, Curie temperature Tc and anisotropy constant $K_1$ (quenched alloys) with Ni content in a FeNi alloy.

The maximum saturation magnetization of FeNi occurs around Ni 46.4 weight %, as illustrated in FIG. 2 obtained from Cullity, "Introduction to Magnetic Materials", page 526, 1972, Addison-Wesley Publishing Company. Composite soft magnetic films are widely used at the composition corresponding to maximum saturation magnetization. For the case of FeNi, the composition is $FeNi_{46.4}$. The saturation values of a FeNi alloy for selected compositions are shown on Table I.

TABLE I

Saturation magnetization of FeNi alloy.

| Ni (weight %) | Saturation magnetization (emu/cc) |
|---|---|
| 46.4 | 1275 |
| 32 | 500 |
| 100 | 500 |
| 32.2 | 567 |
| 95 | 567 |

Co-sputtering $FeNi_{32}$ and Ni in a magnetron could deposit a $FeNi_{46.4}$ film. Similarly, co-sputtering $FeNi_{32.2}$ and $FeNi_{95}$ in a magnetron could deposit a $FeNi_{46.4}$ film also. Here neither $FeNi_{32.2}$ nor $FeNi_{95}$ are simple substance phase. The saturation magnetization of $FeNi_{32}$ and Ni is 0.39 of that of $FeNi_{46.4}$. Assuming identical magnetron cathodes are used for $FeNi_{32}$ and Ni sectors, the ratio X of target area of Ni to the total target area of $FeNi_{32}$ and pure Ni can be expressed by equation (2) for depositing a film with composition of $FeNi_{46.4}$.

$$X = (46.6 - 32)/(100R - 32) \quad (2)$$

wherein R is deposition rate ratio of Ni over $FeNi_{32}$. If Ni and $FeNi_{32}$ have identical deposition rate, X=21.2%.

Our analysis shows that the magnetic field parallel to the target surface at the surface of the soft magnetic target can be approximately represented by equation (3).

$$H = a - B_s * t * b \quad (3)$$

wherein H is the magnetic field parallel to target surface at the surface of the target, $B_s$, is saturation magnetic induction of the target, t is the thickness of the target, a is a constant related to the remanent magnetic induction of the magnets and geometry of the magnetron, and b is a constant related to the geometry of the magnetron. The variables of equation (3) are H, $B_s$, and t. By using $FeNi_{32}$ and Ni as the materials of a composite target instead of using a single component $FeNi_{46.4}$ target, the magnetic field at the target surface is significantly enhanced. For an identical magnetic field in the experimental design, a target thickness can be used for a composite $FeNi_{32}$ and Ni target that is 2.55 times the thickness of a single component $FeNi_{46.4}$ target.

EXAMPLE 2

FeCo-alloy has a very high saturation magnetization. The maximum saturation magnetization, which is higher than that of pure Fe and much higher than that of pure Co, occurs around 30 atomic percent of Co. Additives, other than Co, Ni, Ir, Pt, and Rh, into Fe-alloy usually reduce saturation magnetization of Fe-alloy. Additives, other than Fe, into Co-alloy usually reduce saturation magnetization of Co-alloy. The soft magnetic film of FeCo-alloy can be co-sputter deposited with Fe-alloy and Co-alloy. For instance, FeCoB films can be co-sputtered with FeB and pure Co. Both of FeB and Co have lower saturation magnetization than that of FeCoB.

EXAMPLE 3

Figure 3:
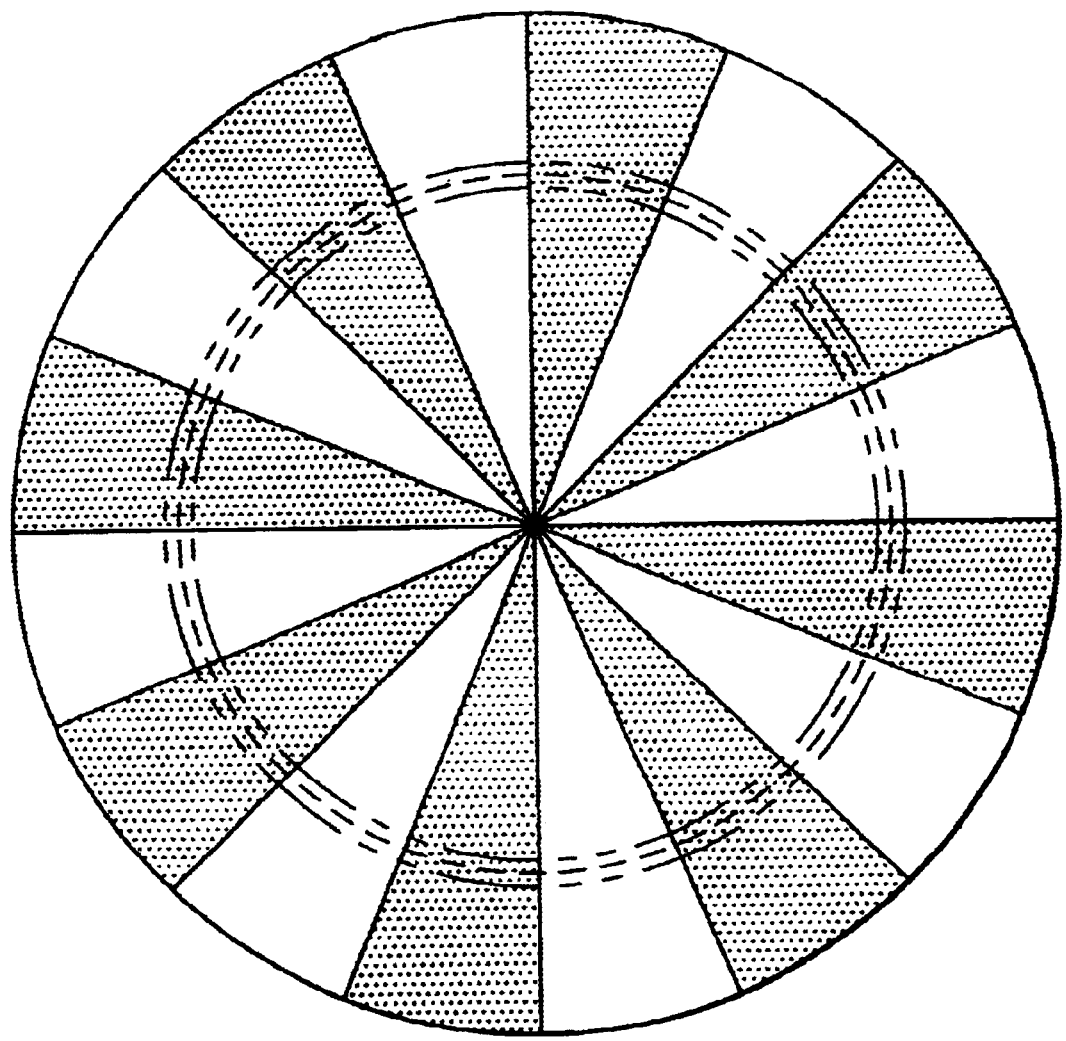
FIG. 3 shows the configuration of a pie-shaped composite target.

FIG. 3 shows one example of target configuration according to this invention. The circular magnetron creates racetrack erosion pattern around the area represented by dashed lines. Two kinds of pie-shaped mosaic sectors comprising target materials, for example, $FeNi_{32}$ and Ni, are located along the donut shaped racetracks of FIG. 3.

The boundary of these two kinds of pie-shaped sectors of the target should be approximately perpendicular to the racetrack direction. The target with area ratio, i.e. i.e. the are length ratio along the racetrack, according with equation (2) will yield a film with $FeNi_{46.4}$ composition.

These pie-shaped sectors can be bonded to a common backing plate or cramped together. When the arc length of the pie-shaped target sectors along the racetrack is small enough, for instance less than 1 cm, depending on the target to substrate distance and other factors, a substantially uniform thickness and substantially uniform composition of the deposited film is achieved. All these target sectors could share one common target power supply or, optionally, multiple power supplies. When $FeNi_{32}$ and Ni are co-sputtered using the pie-shaped target, very uniform erosion is obtained, because $FeNi_{32}$ and Ni have identical saturation magnetization. When $0.9 < Ms_2/Ms_1 < 1.1$, the pie-shaped target is eroded uniformly.

EXAMPLE 4

Figure 4:
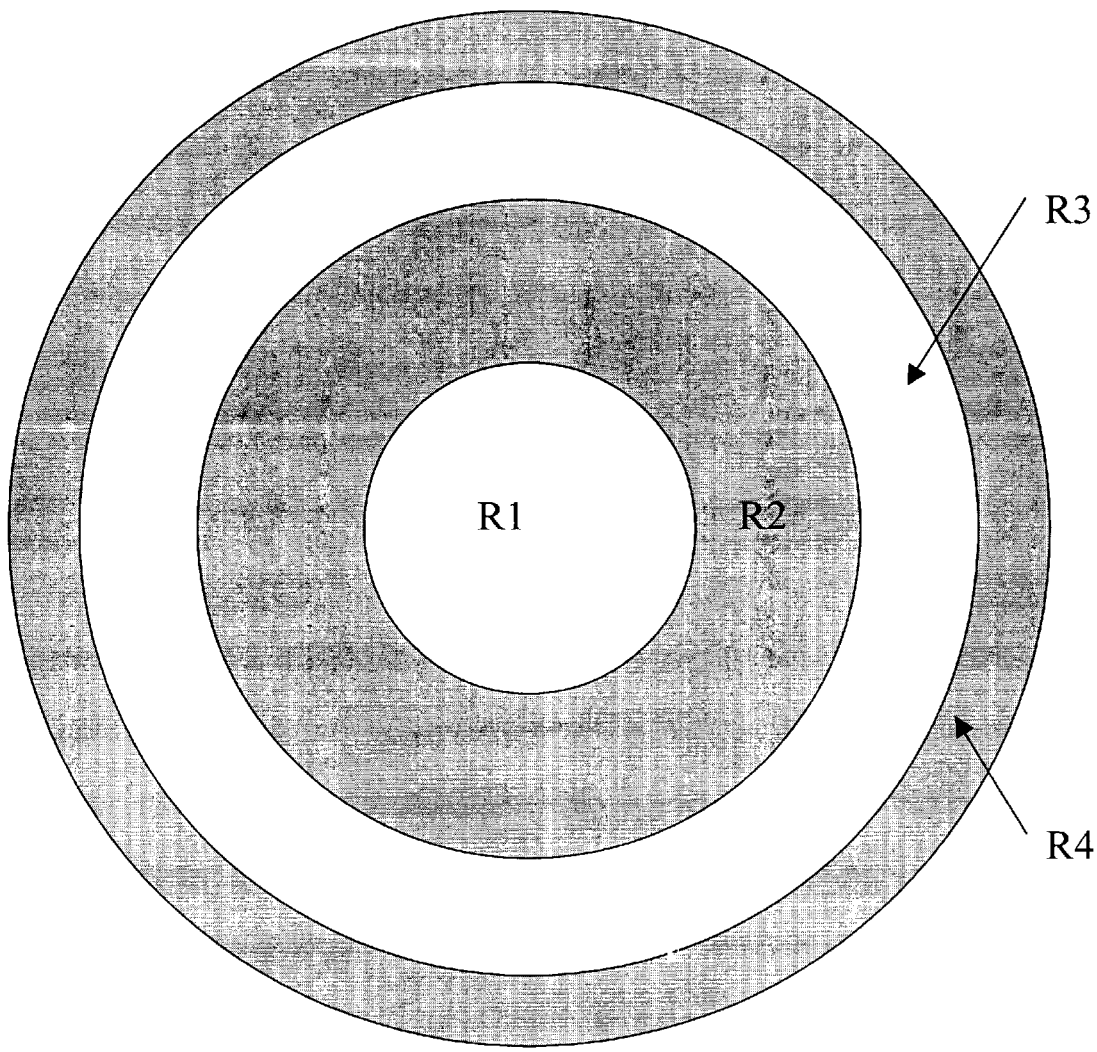
FIG. 4 shows the configuration of an annular nested target.

FIG. 4 shows another example of a target configuration according to this invention. The complete annular concentric nested target has rings (R1, R2, R3 and R4) of alternative materials/compositions A and B. Each ring has its own magnetron magnets and own target power supply. These rings are electrically separated in the composite annular target. Even though materials A and B could have very different saturation magnetization, a substantially uniform film in terms of the composition and thickness can be sputter deposited with such a target. The sputter deposited film formed by co-sputtering species from this target can have no composition gradient and can comprise of a single-phase. This is possible as explained below by referring to FIG. 5.

Figure 5:
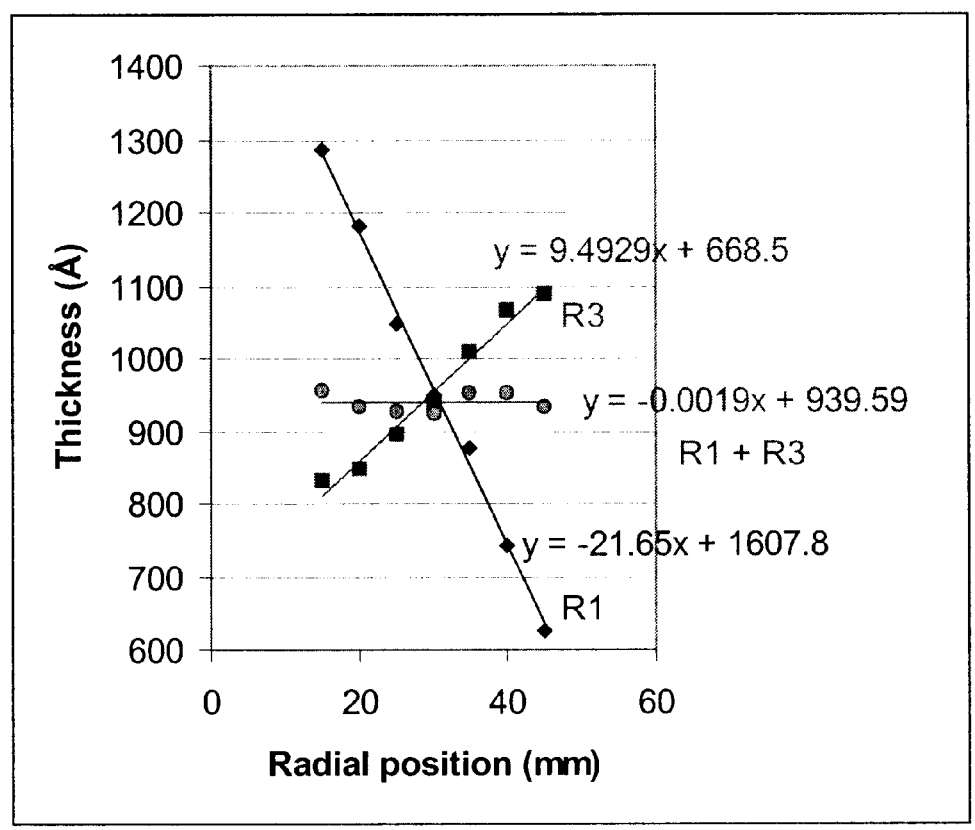
FIG. 5 shows the thickness distribution along the radial direction of a magnetic recording disc sputtered from ring R1 alone, ring R3 alone, and co-sputtered from rings R1 and R3 combined, of the annular nested target of FIG. 4.

FIG. 5 shows the thickness distribution along the radial direction of a magnetic recording disc sputtered from ring R1 alone, ring R3 alone, and co-sputtered from rings R1 and R3 combined, of the annular nested target of FIG. 4. The distance between the target and substrate planes is 50 mm. The outside and inside diameters of R3 are 160 and 112 mm, respectively. The outside diameter of R1 is 56 mm. A CoCrPt alloy is the material of the sputter deposited film. The deposition duration is 40 seconds. The target powers used for R1 and R3 are 300 W and 100 W, respectively. A linear fitting gives two equations for the thickness Y as on of the radial position X:

$$Y_3 = 9.4929X + 668.5 \quad (4)$$

$$Y_1 = -21.65X + 1607.8 \quad (5)$$

When rings R1 and R3 are co-sputtered with identical duration and with sputtering powers of $\alpha*300$ W and $\beta*1000$ W respectively, and when $\alpha$ and $\beta$ satisfy equation (6), the co-sputter deposited film along radial direction has constant thickness Y.

$$9.4929\beta - 21.65\alpha = 0 \quad (6)$$

The circle points on FIG. 5 are calculated points from equation (6) for co-sputtering of 40 seconds with 90 W for R1 and 684 W for R3. This demonstrates that when R1 and R3 have identical composition, a film of a very uniform thickness can be deposited. When $FeNi_{32}$ and Ni are both deposited in this way, the co-sputtered $FeNi_{32}$ and pure Ni ring-shape sectors produce uniform $FeNi_{46.4}$ film in composition and thickness.

The composite soft magnetic films according to this invention are not limited to $FeNi_{46.4}$. Other composite soft magnetic films, such as FeNi, FeNiMo, FeNiCr, FeNiMn, FeNiCu, FeNiCuCr, FeNiMoMn, CoFe, CoFeV, CoFeC, CoFeB, CoNiFe, CoFeNiB, CoFeNiNb, CoFeNiZr, CoFeNiTa, and CoFeNiHf, can also be made according to this invention. The designed composition can be decomposed not only to two materials, but three or more materials with low saturation magnetization. The target shape is not limited to a circular one. Similar configuration to that in FIG. 3 can be used for a rectangular composite target as long as the boundaries between sectors are approximately perpendicular to the racetrack direction. The area near the center of FIG. 3 might not be sputtered. Therefore, the center portion of the target can be taken out or made with other materials. The number of rings of FIG. 4 can be 3, 4, or more.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein.

This application discloses several numerical range limitations. Persons skilled in the art would recognize that the numerical ranges disclosed inherently support any range within the disclosed numerical ranges even though a precise range limitation is not stated verbatim in the specification because this invention can be practiced throughout the disclosed numerical ranges. A holding to the contrary would "let form triumph over substance" and allow the written description requirement to eviscerate claims that might be narrowed during prosecution simply because the applicants broadly disclose in this application but then might narrow their claims during prosecution. Finally, the entire disclosure of the patents and publications referred in this application are hereby incorporated herein by reference.

What is claimed is:

1. A target for magnetron sputtering, comprising a plurality of species that form a film comprising a material of higher saturation magnetization than that of the species.

2. The target of claim 1, wherein the target comprises first and second sectors that are pie-shaped sectors and located along a racetrack of the magnetron.

3. The target of claim 1, wherein the target sputters to form a single-phase film having a substantially uniform thickness and a substantially uniform composition throughout the single-phase film.

4. The target of claim 1, wherein a target material having the highest and lowest magnetic saturations among the plurality of target materials have magnetic saturation of $Ms_h$ and $Ms_1$, respectively, further wherein $0.9 < Ms_h/Ms_1 < 1.1$.

5. The target of claim 1, wherein the target comprises concentric ring-shaped sectors located along a radial direction of the target, and the total number of sectors in the target is more than 2.

6. The target of claim 5, wherein each ring-shaped sector has an associated power supply for applying an electrical potential to the sector.

7. The target of claim 1, wherein a first target material $T_1$ comprises $FeNi_x$, and a second target material $T_2$ comprises $FeNi_y$, wherein x is in a range from about 29 to about 35 in weight percent and y is in the range from about 70 to 100 in weight percent.

8. The target of claim 1, wherein a first target material $T_1$ comprises a moiety selected from Fe, FeNi and FeB and a second target material $T_2$ comprises a moiety selected from Ni, FeNi and Co.

9. The target of claim 8, wherein $T_1$ and/or $T_2$ further comprise an additive selected from Mo, Cr, Mn, Cu, V, C, B, Nb, Zr, Ta and Hf.

10. The target of claim 1, wherein a first target material $T_1$, is $FeNi_{32}$ and a second target material $T_2$ is Ni.

11. A sputtering method, comprising disposing a substrate opposite a target, applying a magnetic field to the target, applying a sputtering voltage to the target and sputtering a film on the substrate, the target comprising a plurality of species that form a film comprising a material of higher saturation magnetization than that of the species.

12. The sputtering method of claim 11, wherein the target comprises first and second sectors that are pie-shaped sectors and located along a racetrack of a magnetron.

13. The sputtering method of claim 11, wherein the film is a single-phase film having a substantially uniform thickness and a substantially uniform composition throughout the single-phase film.

14. The sputtering method of claim 11, wherein a target material having the highest and lowest magnetic saturations among the plurality of target materials have magnetic saturation of $Ms_h$ and $Ms_1$, respectively, further wherein $0.9 < Ms_h/Ms_1 < 1.1$.

15. The sputtering method of claim 11, wherein the target comprises concentric ring-shaped sectors located along a radial direction of the target, and the total number of sectors in the target is more than 2.

16. The sputtering method of claim 15, wherein each sector has an associated power supply for applying an electrical potential to the sector.

17. The sputtering method of claim 11, wherein a first target material $T_1$ comprises $FeNi_x$ and a second target material $T_2$ comprises $FeNi_y$, wherein x is in a range from about 29 to about 35 in weight percent and y is in the range from about 70 to 100 in weight percent.

18. The sputtering method of claim 11, wherein a first target material $T_1$ comprises a moiety selected from Fe, FeNi and FeB and a second target material $T_2$ comprises a moiety selected from Ni, FeNi and Co.

19. The sputtering method of claim 11, wherein a first target material $T_1$ is $FeNi_{32}$ and a second target material $T_2$ is Ni.

20. A sputtering source, comprising a magnet and means for sputtering a plurality of species that form a film comprising a material of higher saturation magnetization than that of the species.

* * * * *